(12) United States Patent
Abe (10) Patent No.: US 8,487,668 B2
(45) Date of Patent: Jul. 16, 2013

(54) SEMICONDUCTOR DRIVE DEVICE

(75) Inventor: Yasushi Abe, Hino (JP)

(73) Assignee: Fuji Electric Co., Ltd. (JP)

( * ) Notice: Subject to any disclaimer, the term of this patent is extended or adjusted under 35 U.S.C. 154(b) by 106 days.

(21) Appl. No.: 13/148,431

(22) PCT Filed: Jul. 28, 2010

(86) PCT No.: PCT/JP2010/062697
§ 371 (c)(1),
(2), (4) Date: Oct. 4, 2011

(87) PCT Pub. No.: WO2011/024591
PCT Pub. Date: Mar. 3, 2011

(65) Prior Publication Data
US 2012/0025873 A1 Feb. 2, 2012

(30) Foreign Application Priority Data
Aug. 27, 2009 (JP) ................................. 2009-196954

(51) Int. Cl.
*H03B 1/00* (2006.01)
*H03K 3/00* (2006.01)

(52) U.S. Cl.
USPC ............ 327/109; 327/108; 327/110; 327/434

(58) Field of Classification Search
USPC ......................................... 327/108, 109, 434
See application file for complete search history.

(56) References Cited

U.S. PATENT DOCUMENTS

| 5,977,814 A * | 11/1999 | Ishii .............................. 327/434 |
| 6,288,597 B1 * | 9/2001 | Hasegawa et al. ............ 327/513 |
| 2002/0021539 A1 | 2/2002 | Odaohhara et al. |
| 2003/0048097 A1 | 3/2003 | Ishihara et al. |
| 2007/0064370 A1 | 3/2007 | Kajiwara |

FOREIGN PATENT DOCUMENTS

| JP | 6-88191 U | 12/1994 |
| JP | 2002-076868 A | 3/2002 |
| JP | 2003-088100 A | 3/2003 |
| JP | 2006-050865 A | 2/2006 |
| JP | 2007-082036 A | 3/2007 |

OTHER PUBLICATIONS

International Search Report issued in PCT/JP2010/062697 dated Aug. 24, 2010.

* cited by examiner

*Primary Examiner* — John Poos
(74) *Attorney, Agent, or Firm* — Rossi, Kimms & McDowell LLP (57) ABSTRACT

When there is a short circuit failure between the gate and emitter of a main switching element such as an IGBT, the temperature of a turn-on gate resistor or turn-off gate resistor is detected by a thermistor, and a drive circuit is protected by turning off a turn-on gate drive switching element or a turn-off gate drive switching element. Furthermore, instead of detecting the temperature of the turn-on gate resistor or turn-off gate resistor, a thermistor is connected in series with the turn-on gate drive switching element or turn-off gate drive switching element, the resistance change corresponding to a change in temperature of the thermistor is detected, and the drive circuit is protected by turning off the turn-on gate drive switching element or turn-off gate drive switching element.

18 Claims, 10 Drawing Sheets

SEMICONDUCTOR DRIVE DEVICE

CROSS-REFERENCE TO RELATED APPLICATIONS

This application is a National stage application of, and claims priority from, PCT Application No. PCT/JP2010/062697 filed on Jul. 28, 2010.

TECHNICAL FIELD

The present invention relates, in a drive circuit that controls the turning on and off of a semiconductor device such as an IGBT (Insulated Gate Bipolar Transistor), to the protection of the drive circuit when there is a short circuit breakdown of the semiconductor device, and impedance drops.

BACKGROUND ART

Figure 1:
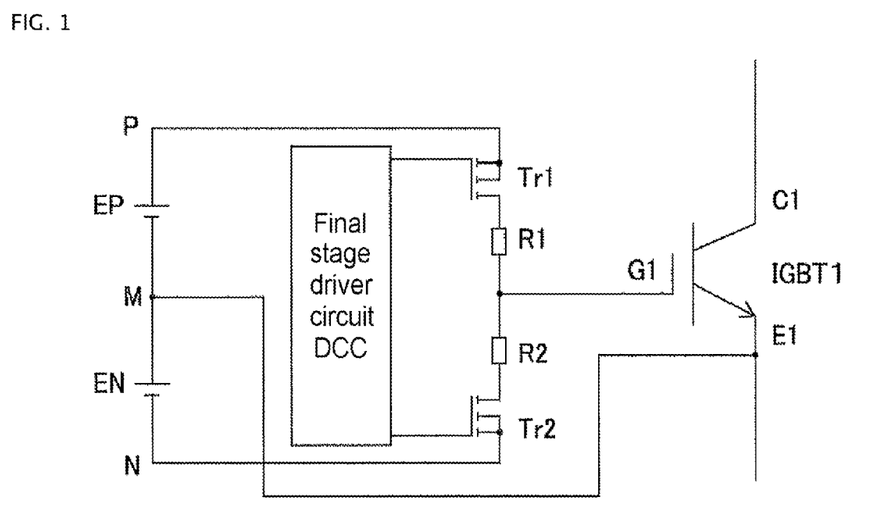
FIG. 1 is a drive circuit diagram showing a heretofore known example.

FIG. 1 shows a configuration of a drive circuit using a heretofore known technology. In the drawing, EP represents a forward biasing power source, EN a reverse biasing power source, Tr1 a forward biasing switching element, Tr2 a reverse biasing switching element, R1 a forward biasing gate resistor, and R2 a reverse biasing gate resistor. A final-stage driver circuit DCC is a circuit for driving the MOSFETs Tr1 and Tr2 in accordance with a control signal. Herein, an IGBT (IGBT 1) is used as a semiconductor device. MOSFET is an abbreviation of Metal Oxide Semiconductor Field Effect Transistor.

With this kind of configuration, when a short circuit breakdown occurs in the semiconductor device, there is a high possibility of a short circuit breakdown occurring between all terminals G1, C1, and E1 of the IGBT 1. For this reason, in the case of FIG. 1, when there is a short circuit condition between the gate terminal G1 and emitter terminal E1, the output of the drive circuit connected between these terminals is short-circuited, a large current determined by the forward biasing power source EP and forward biasing gate resistor R1 continues to flow when the MOSFET Tr1 is turned on, and a large current determined by the reverse biasing power source EN and reverse biasing resistor R2 continues to flow when the MOSFET Tr2 is turned on. With the circuit type of FIG. 1, when taking into consideration the breakdown of the semiconductor device, it is essential to design in such a way that this kind of current can be tolerated, so the capacities of the biasing power sources EP and EN and gate resistors R1 and R2 through which the current flows increase, leading to an increase in size and an increase in cost of the drive circuit. Furthermore, when the drive circuit power source is shared, there also occurs a problem in that an overcurrent in one drive circuit renders another drive circuit inoperative.

Figure 2:
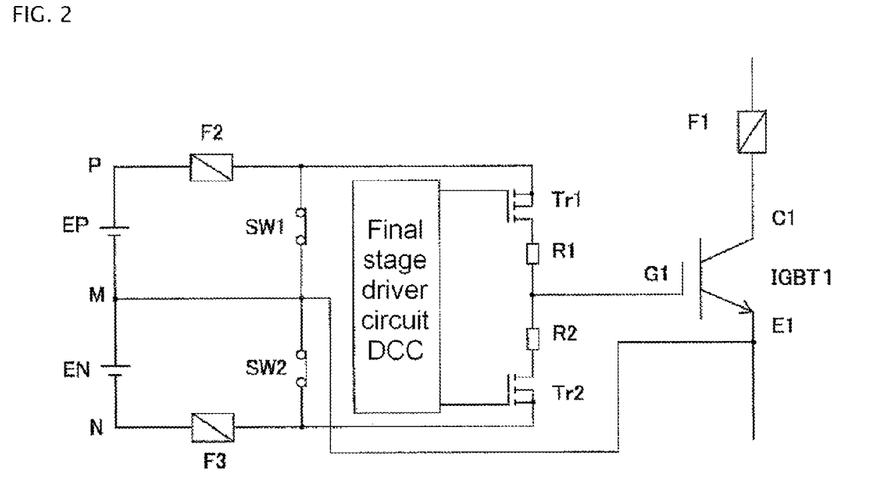
FIG. 2 is a drive circuit diagram with protection function showing a heretofore known example.

As a heretofore technology that ameliorates this kind of problem, the method shown in FIG. 2 shown in Patent Document 1 is known. EP represents a forward biasing power source, EN a reverse biasing power source, Tr1 a forward biasing switching element, Tr2 a reverse biasing switching element, R1 a forward biasing gate resistor, and R2 a reverse biasing gate resistor. Also, F1, F2, and F3 represent fuses, SW1 represents a forward biasing power source short circuiting switch, and SW2 represents a reverse biasing power source EN short circuiting switch.

A description will be given of actions in this circuit when a short circuit breakdown occurs in an IGBT, which is a semiconductor device. When an IGBT 1 short circuits, and a large current flows through a collector, the fuse F1 melts down. Means of detecting a meltdown being provided in the fuse F1, when a meltdown is detected, the switches SW1 and SW2 are turned on. When these switches are turned on, the biasing power sources EP and EN are short circuited via the fuses F2 and F3, and the fuses F2 and F3 melt down. Owing to these kinds of action, the biasing semiconductor switches Tr1 and Tr2 are cut off from the biasing power sources in a short time, meaning that the large current in the drive circuit that occurs in FIG. 1 does not occur.

Patent Document 1: JP-UM-A-6-88191

DISCLOSURE OF THE INVENTION

As heretofore described, with the heretofore known technology, fuses are provided in the drive circuit and, by actively causing the fuses to melt down when the semiconductor device breaks down, protection of the drive circuit is realized. However, with this method, a fuse is also necessary in the circuit through which the main current flows in order to detect a failure of the semiconductor device, meaning that in a large capacity device, the circuit increases in size. Also, as it is necessary to replace each fuse after the protection is activated, in a device with a large number of drive circuits, a long time is needed for failure recovery. Consequently, a problem for the invention is to detect a short circuit breakdown of a semiconductor device without using a fuse, and protect the drive circuit.

In order to solve the heretofore described problem, in the invention, a configuration is such that a first thermistor is thermally joined to and installed in a turn-on gate resistor, a second thermistor is thermally joined to and installed in a turn-off gate resistor, and a current constantly flows through the thermistors, and there is provided means which, when the temperature of either one of the gate resistors rises, turns off the first or second switching element by the resistance value of the corresponding thermistor changing, and the current changing.

Also, in another invention, thermistors are connected in series with first and second switching elements respectively, and there is provided means which, when the temperature of a thermistor rises due to an overcurrent when there is a short circuit between the gate and emitter of an IGBT, turns off the first or second switching element.

As a result of this, semiconductor device fuses and fuses that cut off the drive circuit power source are unnecessary, and it is possible to reduce the size of the device, and to reduce the part replacement time at a time of failure recovery.

Furthermore, as an operation of the means of turning off the first or second switching element is detected by a photocoupler, and the signal is output from the drive device, operation and display of a cutting off of the device or failure occurrence is possible in a control circuit using the signal, and user-friendliness improves.

BEST MODE FOR CARRYING OUT THE INVENTION

Hereafter, a description will be given, while referring to the drawings, of an embodiment of the invention.

Example 1

Figure 3:
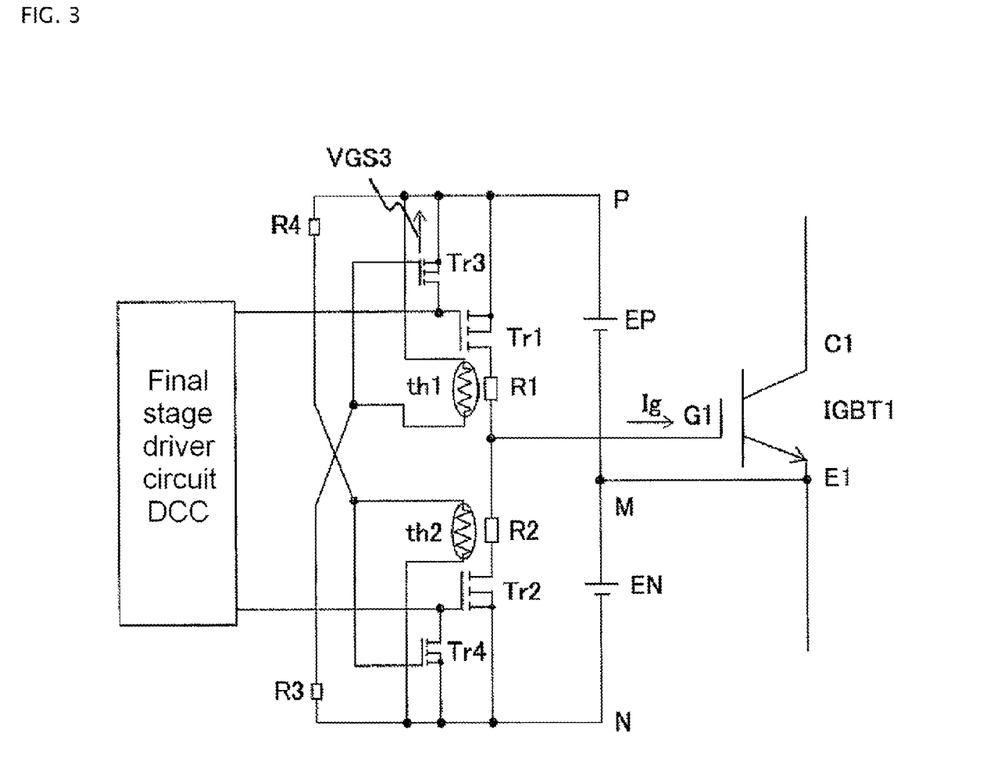
FIG. 3 is a circuit diagram showing a first example of the invention.

FIG. 3 shows a first example of the invention. The difference from FIG. 1, which is a heretofore known circuit, is that thermistors (in this example, PTC thermistors whose resistance values increase in accordance with a temperature rise) th1 and th2 whose resistance values change depending on the temperature are installed in gate resistors R1 and R2, the drain and source of a P-channel type MOSFET Tr3 are connected between the gate and source of a P-channel type MOSFET Tr1, which is a forward biasing switching element, the drain and source of an N-channel type MOSFET Tr4 are connected between the gate and source of an N-channel type MOSFET Tr2, which is a reverse biasing switching element, a series circuit of the thermistor th1 and resistor R3 and a series circuit of the thermistor th2 and resistor R4 are connected between the positive electrode of a forward biasing power source EP and the negative electrode of a reverse biasing power source, the gate of the P-channel type MOSFET Tr3 is connected to the series connection point of the thermistor th1 and resistor R3, and the gate of the N-channel type MOSFET Tr4 is connected to the series connection point of the thermistor th2 and resistor R4.

With this kind of configuration, when the temperature of the turn-on gate resistor R1 rises in a condition in which there is a short circuit failure between the gate and emitter of an IGBT 1 and a turn-on signal is emitted, the resistance value of the thermistor th1 rises, the MOSFET Tr3 is turned on when the voltage between the two ends of the thermistor th1 exceeds the threshold value voltage between the gate and source of the MOSFET Tr3, and the MOSFET Tr1 is turned off. Also, when the temperature of the turn-off gate resistor R2 rises in a condition in which there is a short circuit failure between the gate and emitter of the IGBT 1 and a turn-off signal is emitted, the resistance value of the thermistor th2 rises, the MOSFET Tr4 is turned on when the voltage between the two ends of the thermistor th2 exceeds the threshold value voltage between the gate and source of the MOSFET Tr4, and the MOSFET Tr2 is turned off.

Figure 4:
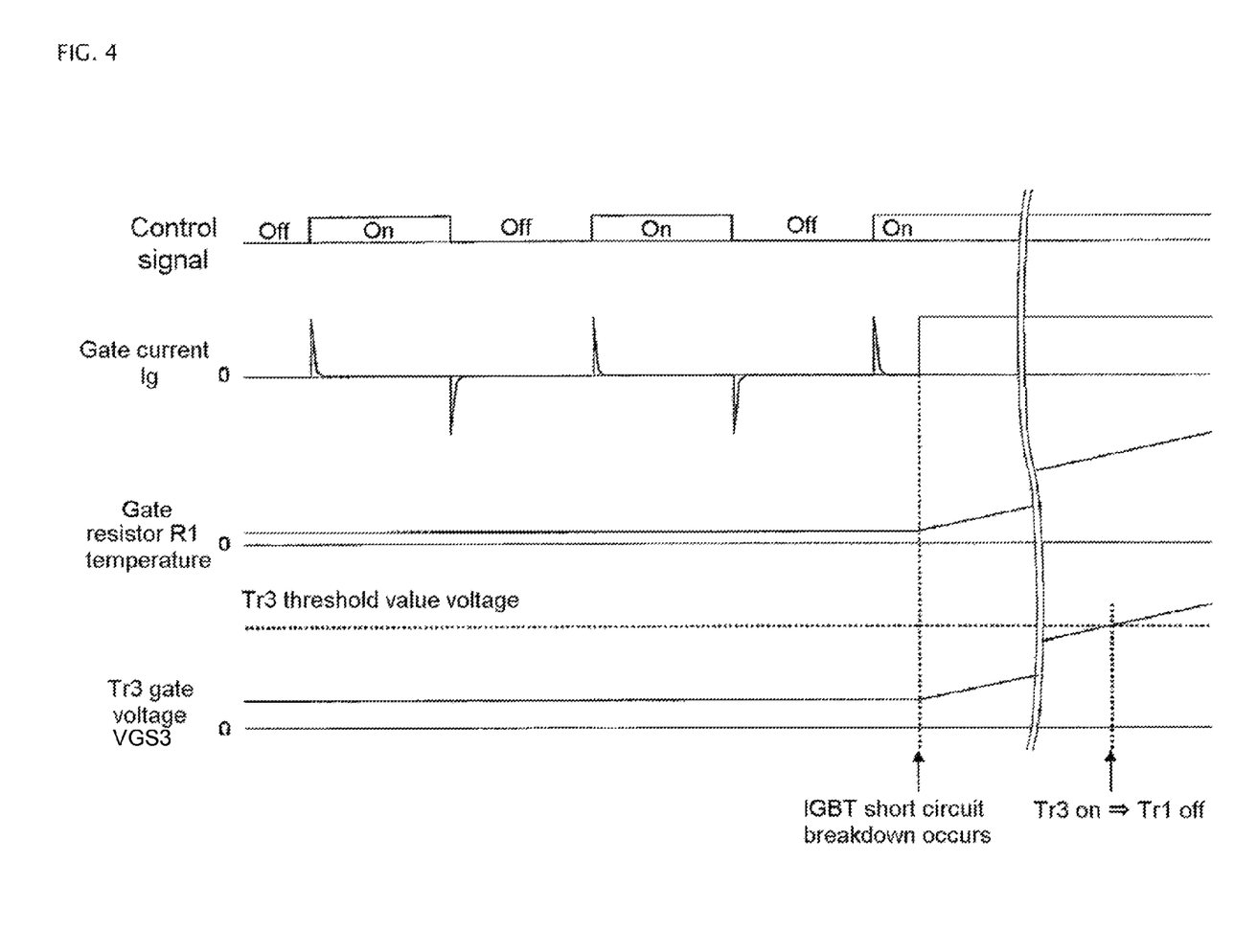
FIG. 4 is an action illustration of FIG. 1.

FIG. 4 shows the action of each portion when a short circuit breaking occurs between an IGBT gate and source. These actions show a condition under which the breaking occurs with the IGBT in a turned on condition. When the IGBT 1 is normal, a gate current Ig has a waveform flowing for only a short time at a time of a gate voltage rising edge or falling edge when switching, as shown in the drawing, and the temperature of the forward biasing gate resistor R1 is maintained at or below a certain value. When the IGBT 1 breaks, and a short circuit occurs between the gate (G1) and emitter (E1), a current determined by a forward biasing power source voltage E1 and the turn-on gate resistor R1 continues to flow through the turn-on gate resistor R1, meaning that the temperature of the R1 rises.

Along with this, the resistance value of the thermistor th1 increases, and a voltage VGS3 applied to the input portion of the MOSFET Tr3 increases. When this reaches the gate threshold value voltage of the MOSFET Tr3, the MOSFET Tr3 is turned on, the input signal of the turn-on switching element Tr1 becomes 0, and the Tr1 is turned off. Owing to this kind of action, the current flowing in the drive circuit is interrupted.

At a time too of an IGBT breaking when the IGBT 1 is in a turned off condition, that is, when the turn-off switching element Tr2 is turned on, owing to the same kinds of action, when the temperature of the turn-off gate resistor R2 rises, the resistance value of the thermistor th2 increases, the MOSFET Tr4 is turned on, and the turn-off switching element Tr2 is turned off. As it is possible to protect the drive circuit in this way without causing the meltdown of a fuse, it is possible to recover the circuit without the need to replace a part.

Example 2

Figure 5:
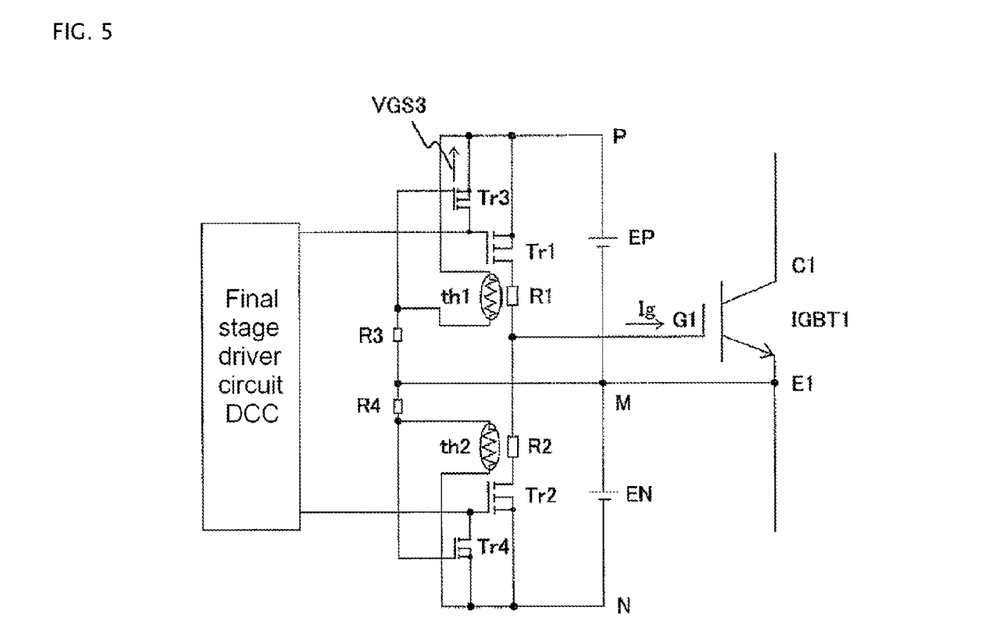
FIG. 5 is a circuit diagram showing a second example of the invention.

FIG. 5 shows a second example of the invention. The difference from the first example is that the series circuit of the thermistor th1 and resistor R3 is connected between the positive electrode and negative electrode of the forward biasing power source EP, and the series circuit of the thermistor th2 and resistor R4 is connected between the positive electrode and negative electrode of the reverse biasing power source EN. By adopting this circuit configuration, it is possible to keep the resistance and the power consumption of the drive power sources (EP and EN) low.

Example 3

Figure 6:
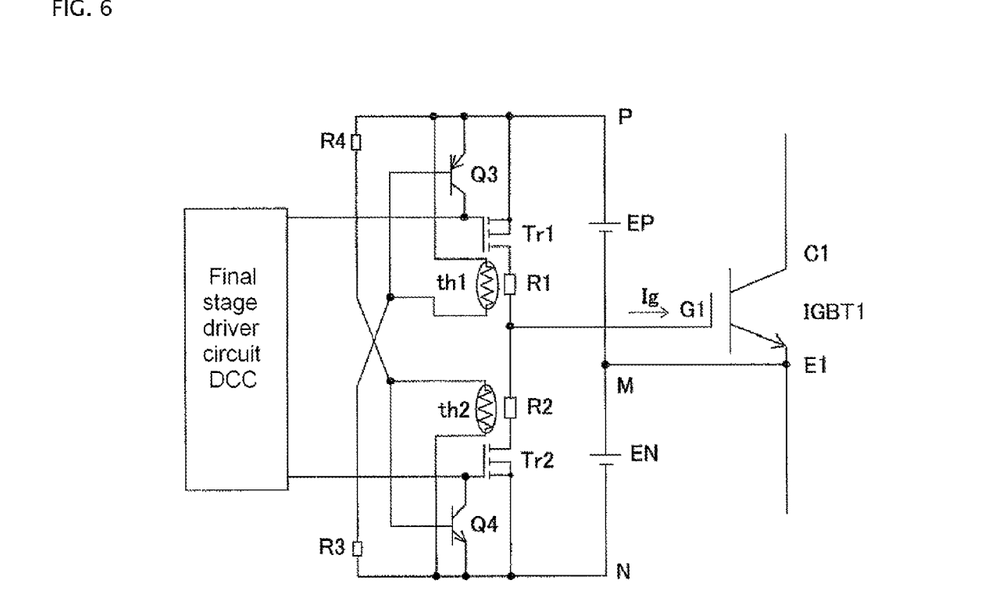
FIG. 6 is a circuit diagram showing a third example of the invention.

FIG. 6 shows a third example of the invention. The difference from the first example is that the P-channel type MOSFET Tr3 is changed to a PNP transistor Q3, and the N-channel type MOSFET Tr4 is changed to an NPN transistor Q4. The actions are the same as in the first example, but there is an advantage in that, by using current drive types of transistor, the noise tolerance increases. Herein, in order to further increase the noise tolerance, it is also possible to connect a Zener diode or the like in series with the base.

Example 4

Figure 7:
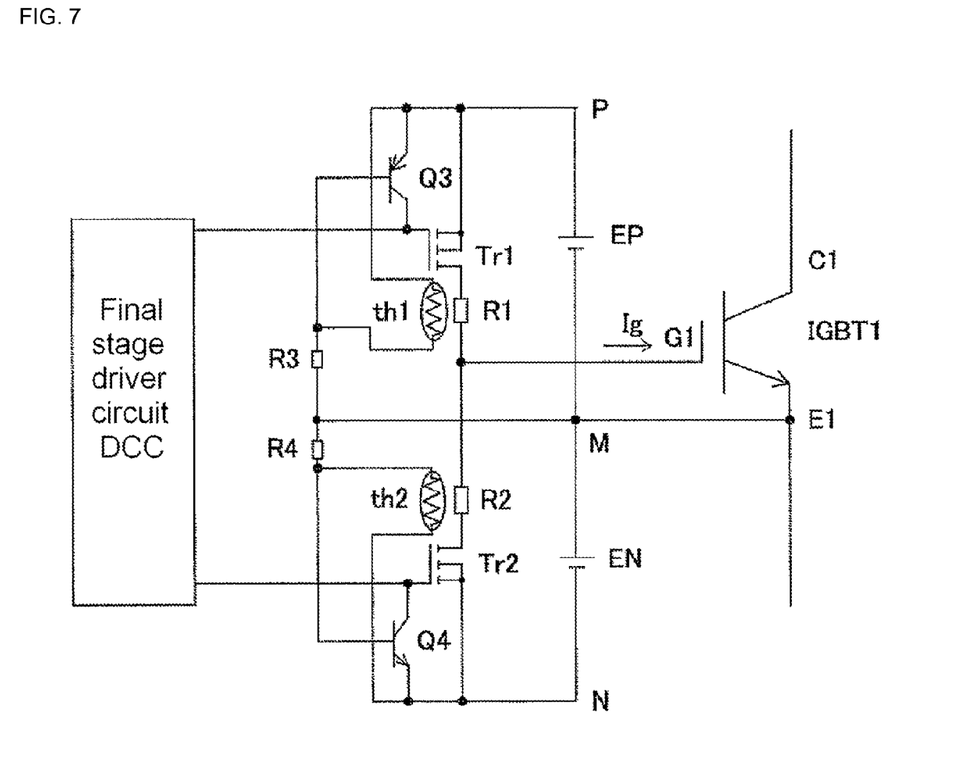
FIG. 7 is a circuit diagram showing a fourth example of the invention.

FIG. 7 shows a fourth example of the invention. The difference from the third example is that the series circuit of the thermistor th1 and resistor R3 is connected between the positive electrode and negative electrode of the forward biasing power source EP, and the series circuit of the thermistor th2 and resistor R4 is connected between the positive electrode and negative electrode of the reverse biasing power source EN. By adopting this circuit configuration, it is possible to keep the resistance and the power consumption of the drive power sources (EP and EN) low.

Example 5

Figure 8:
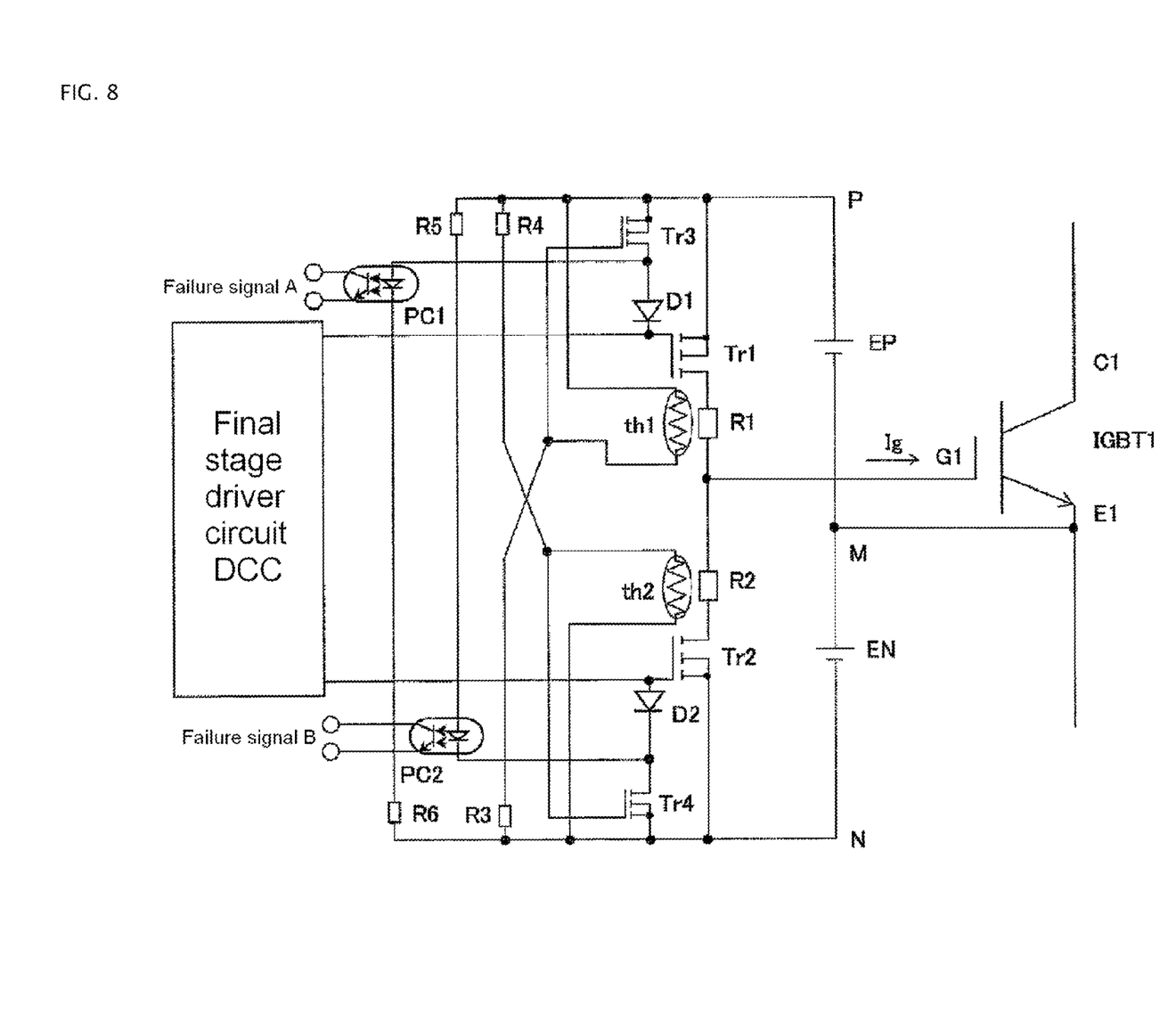
FIG. 8 is a circuit diagram showing a fifth example of the invention.

FIG. 8 shows a fifth example of the invention. The difference from the first example is that a diode D1 is connected between the drain of the P-channel type MOSFET Tr3 and the gate of the P-channel type MOSFET Tr1, which is a forward biasing switching element, a series circuit of the primary side of a photocoupler PC1 and a resistor R6 is connected between the series connection point of the drain of the MOSFET Tr3 and diode D1 and the negative electrode of the reverse biasing power source EN, a diode D2 is connected between the drain of the N-channel type MOSFET Tr4 and the gate of the N-channel type MOSFET Tr2, which is a reverse biasing switching element, and a series circuit of the primary side of a photocoupler PC2 and a resistor R5 is connected between the series connection point of the drain of the MOSFET Tr4 and diode D2 and the positive electrode of the forward biasing power source EP, wherein the secondary sides of the photocouplers PC1 and PC2 are output to the exterior as failure signals A and B. By incorporating these signals in a control circuit or operation and display circuit, it is possible to realize device protection, stopping, failure display, and the like, and operability and user-friendliness improve.

Example 6

Figure 9:
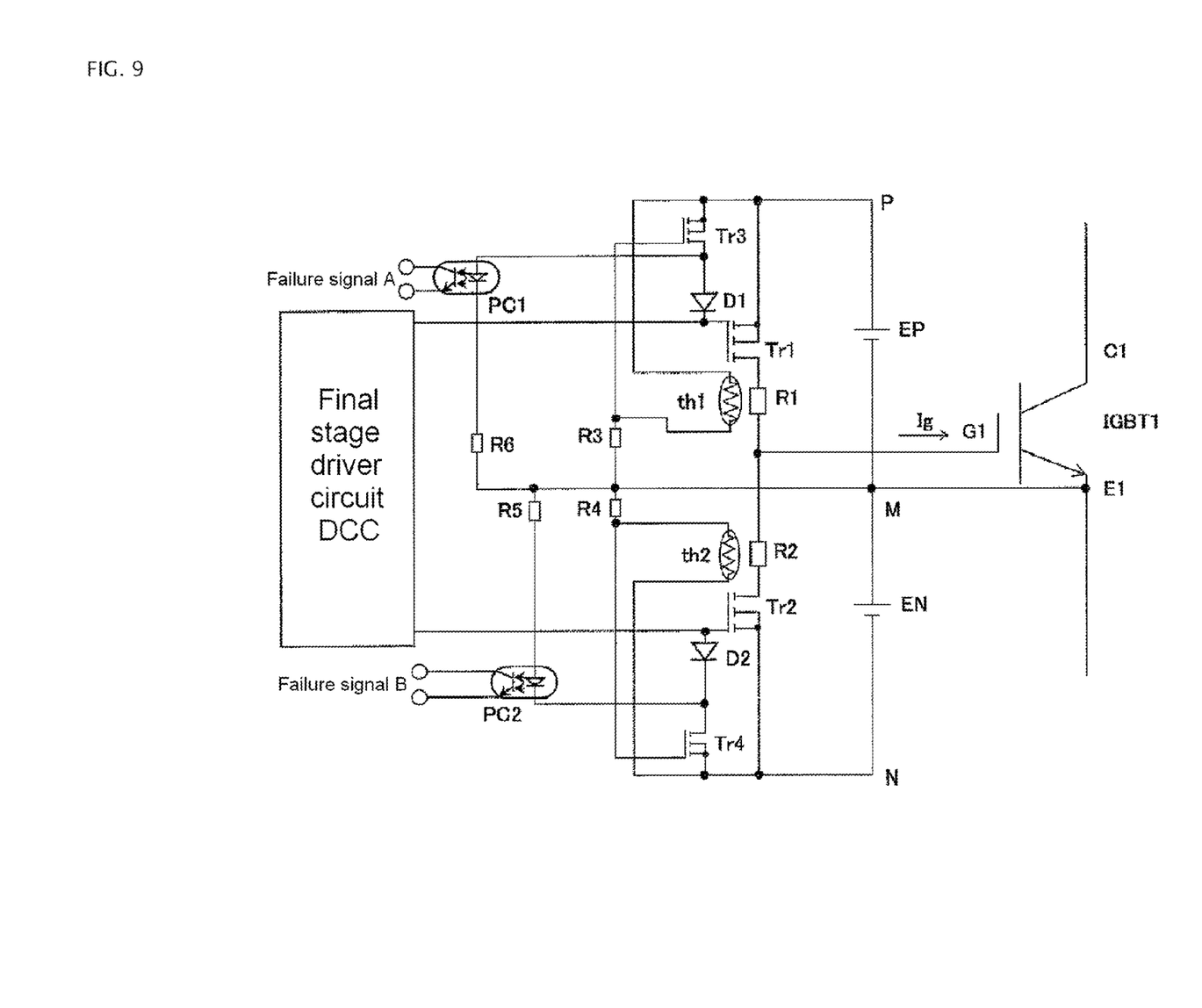
FIG. 9 is a circuit diagram showing a sixth example of the invention.

FIG. 9 shows a sixth example of the invention. The difference from the fifth example is that the series circuit of the primary side of the photocoupler PC1 and resistor R6 and the series circuit of the primary side of the photocoupler PC2 and resistor R5 are connected between the series connection point of the drain of the MOSFET Tr3 and diode D1 and the negative electrode of the forward biasing power source EP, and the series circuit of the primary side of the photocoupler PC2 and resistor R5 is connected between the series connection point of the drain of the MOSFET Tr4 and diode D2 and the positive electrode of the reverse biasing power source EN. By adopting this circuit configuration, it is possible to keep the resistance and the power consumption of the drive power sources (EP and EN) low.

Example 7

Figure 10:
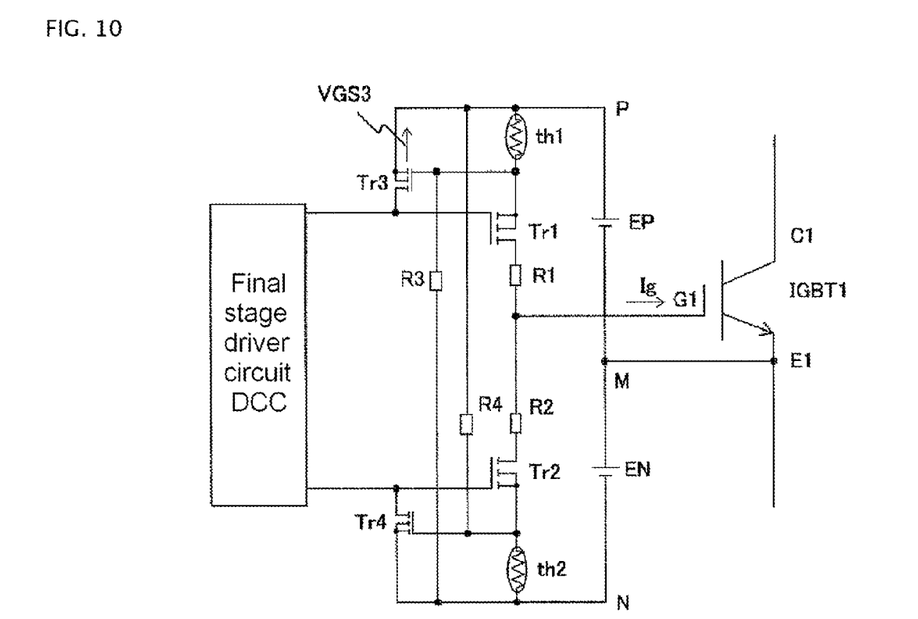
FIG. 10 is a circuit diagram showing a seventh example of the invention.

FIG. 10 shows a seventh example of the invention. The difference from the first example is that the first thermistor th1 is connected in series with the P-channel type MOSFET Tr1, the second thermistor th2 is connected in series with the N-channel type MOSFET Tr2, the gate of the P-channel type MOSFET Tr3 and the resistor R3 are connected to the series connection point of the P-channel type MOSFET Tr1 and first thermistor th1, and the gate of the N-channel type MOSFET Tr4 and the resistor R4 are connected to the series connection point of the N-channel type MOSFET Tr2 and second thermistor th2, wherein, when the temperature of either one of the first thermistor th1 or second thermistor th2 rises to or above a predetermined value, the MOSFET Tr1 or MOSFET Tr2 is turned off. Herein, one end of the resistor R3 is connected to the negative electrode of the reverse biasing power source EN, and one end of the resistor R4 is connected to the positive electrode of the forward biasing power source EP.

When there is a short circuit failure between the gate and emitter of the IGBT 1, the MOSFET Tr1 is turned on when a turn-on signal is emitted so, as an excessive current flows in the thermistor th1, the temperature of the thermistor th1 rises, and the resistance value increases, the result is that the MOSFET Tr3 is turned on, the MOSFET Tr1 is turned off, and the drive circuit is protected. Also, the MOSFET Tr2 is turned on when a turn-off signal is emitted so, as an excessive current flows in the thermistor th2, the temperature of the thermistor th2 rises, and the resistance value increases, the result is that the MOSFET Tr4 is turned on, the MOSFET Tr2 is turned off, and the drive circuit is protected.

Example 8

Figure 11:
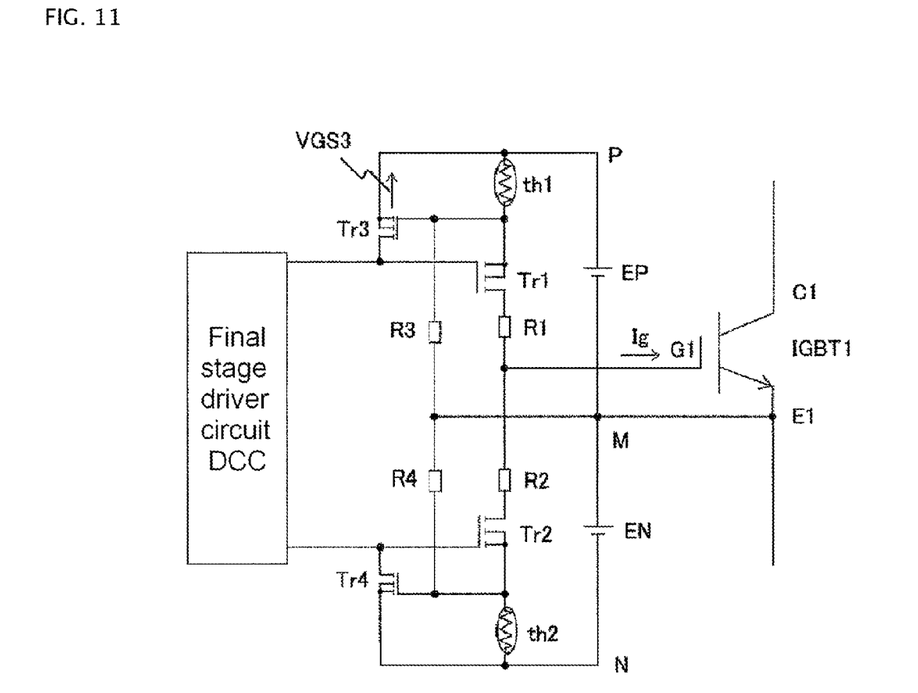
FIG. 11 is a circuit diagram showing an eighth example of the invention.

FIG. 11 shows an eighth example of the invention. The difference from the seventh example is that one end of the resistors R3 and R4 is connected to the negative electrode of the forward biasing power source (the positive electrode of the reverse biasing power source).

By adopting this configuration, as well as the loss of the resistors R3 and R4 decreasing, it is possible to reduce the capacity of the drive circuit power sources (EP and EN).

Example 9

Figure 12:
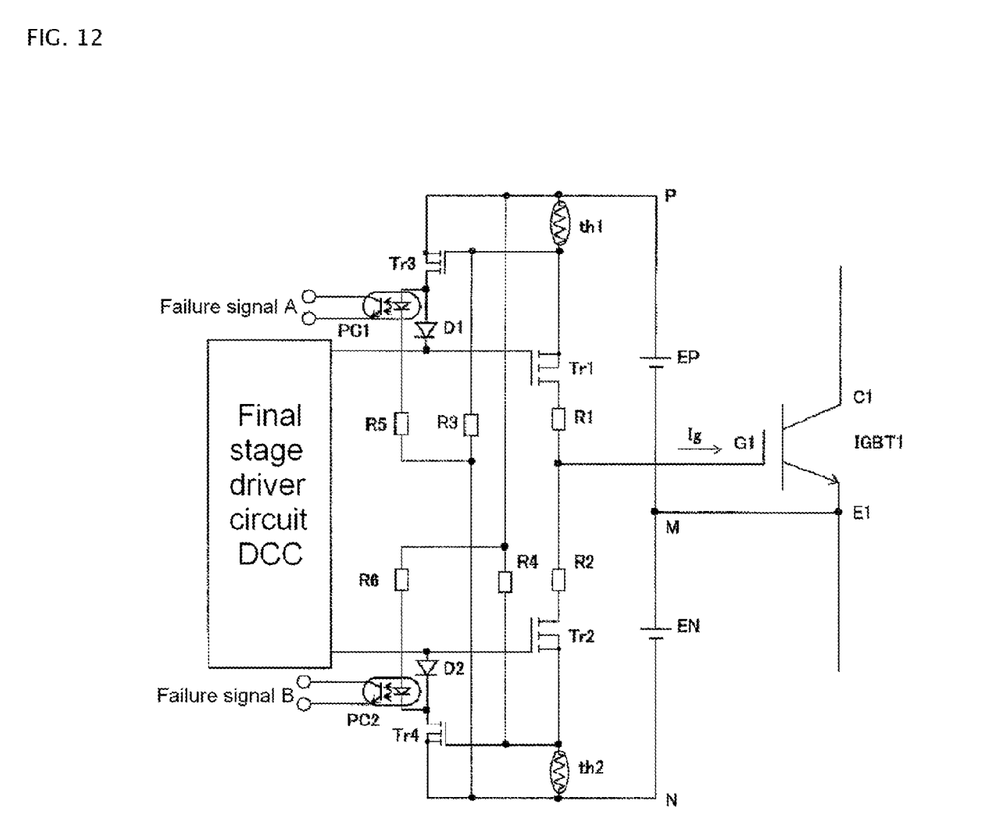
FIG. 12 is a circuit diagram showing a ninth example of the invention.

FIG. 12 shows a ninth example of the invention. The difference from the seventh example is that a diode D1 is connected between the drain of the P-channel type MOSFET Tr3 and the gate of the P-channel type MOSFET Tr1, which is a forward biasing switching element, a series circuit of the primary side of a photocoupler PC1 and a resistor R6 is connected between the series connection point of the drain of the MOSFET Tr3 and diode D1 and the negative electrode of the reverse biasing power source EN, a diode D2 is connected between the drain of the N-channel type MOSFET Tr4 and the gate of the N-channel type MOSFET Tr2, which is a reverse biasing switching element, and a series circuit of the primary side of a photocoupler PC2 and a resistor R5 is connected between the series connection point of the drain of the MOSFET Tr4 and diode D2 and the positive electrode of the forward biasing power source EP, wherein the secondary sides of the photocouplers PC1 and PC2 are output to the exterior as failure signals A and B. By incorporating these signals in a control circuit or operation and display circuit, it is possible to realize device protection, stopping, failure display, and the like, and operability and user-friendliness improve.

Example 10

Figure 13:
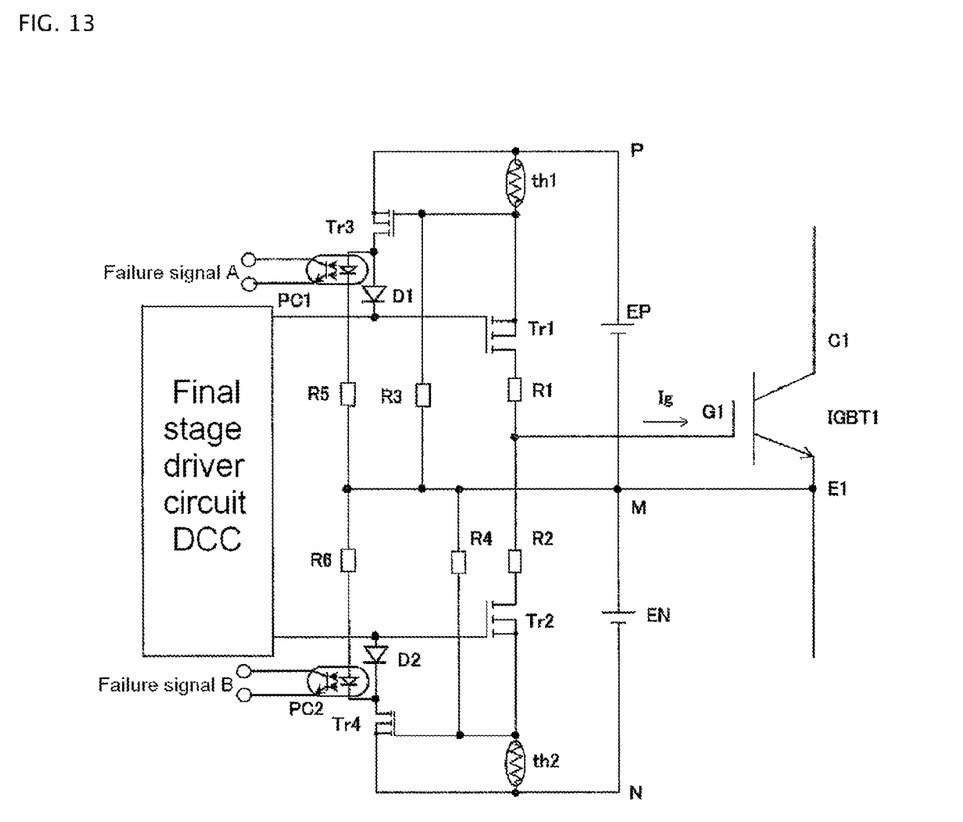
FIG. 13 is a circuit diagram showing a tenth example of the invention.

FIG. 13 shows a tenth example of the invention. The difference from the ninth example is that one end of the resistors R3 and R4 is connected to the negative electrode of the forward biasing power source (the positive electrode of the reverse biasing power source). By adopting this configuration, as well as the loss of the resistors R3 and R4 decreasing, it is possible to reduce the capacity of the drive circuit power sources (EP and EN).

In the fifth example to the tenth example too, in the same way as in the third and fourth examples, it is possible to replace the P-channel type MOSFET Tr3 with the PNP transistor Q3, and the N-channel type MOSFET Tr4 with the NPN transistor Q4.

The points heretofore described are summarized as follows as the main point of the invention. That is, the main point of the invention is that, when there is a short circuit failure between the gate and emitter of a main switching element such as an IGBT, the temperature of a turn-on gate resistor or turn-off gate resistor is detected by a thermistor, and the drive circuit is protected by turning off a turn-on gate drive switching element or a turn-off gate drive switching element. Furthermore, instead of detecting the temperature of the turn-on gate resistor or turn-off gate resistor, a thermistor is connected in series with the turn-on gate drive switching element or turn-off gate drive switching element, the resistance change corresponding to a change in temperature of the thermistor is detected, and the drive circuit is protected by turning off the turn-on gate drive switching element or turn-off gate drive switching element.

INDUSTRIAL APPLICABILITY

The invention can be applied to an uninterruptible power system, an electromotor drive inverter, a direct current power supply unit, an induction heating device, or the like, to which is applied a switching element such as an IGBT (Insulated Gate Bipolar Transistor) or a MOSFET (Metal Oxide Semiconductor Field Effect Transistor).

The invention claimed is:

1. A semiconductor drive device characterized by including: a turn-on drive circuit including a forward biasing power source, a first switching element, and a turn-on gate resistor for turning on a semiconductor element; and a turn-off drive circuit including a reverse biasing power source, a second switching element, and a turn-off gate resistor for turning off the semiconductor element, wherein the forward biasing power source and reverse biasing power source are connected in series, a first series circuit of a first thermistor thermally joined to the turn-on gate resistor and a first resistor connected in series is connected between the positive electrode of the forward biasing power source and the negative electrode of the reverse biasing power source, or between the positive electrode and negative electrode of the forward biasing power source, and a second series circuit of a second thermistor thermally joined to the turn-off gate resistor and a second resistor connected in series is connected between the positive electrode of the forward biasing power source and the negative electrode of the reverse biasing power source, or between the positive electrode and negative electrode of the reverse biasing power source, and wherein there is provided means of turning off the first or second switching element when the temperature of either one of the turn-on gate resistor or turn-off gate resistor rises to or above a predetermined value.

2. The semiconductor drive device according to claim 1, characterized in that the means of turning off the first switching element is a third switching element wherein a control terminal is connected to an internal connection point of a first series circuit in which one end of the first thermistor is connected to the positive electrode of the forward biasing power source and one end of the first resistor is connected to the negative electrode of the reverse biasing power source, one main terminal is connected to the positive electrode of the forward biasing power source, and the other main terminal is connected to a control terminal of the first switching element.

3. The semiconductor drive device according to claim 1, characterized in that the means of turning off the second switching element is a fourth switching element wherein a control terminal is connected to an internal connection point of a second series circuit in which one end of the second thermistor is connected to the negative electrode of the reverse biasing power source and one end of the second resistor is connected to the positive electrode of the forward biasing power source, one main terminal is connected to the negative electrode of the reverse biasing power source, and the other main terminal is connected to a control terminal of the second switching element.

4. The semiconductor drive device according to claim 1, characterized in that the third switching element is a P-channel type MOSFET.

5. The semiconductor drive device according to claim 1, characterized in that the third switching element is a PNP type transistor.

6. The semiconductor drive device according to claim 1, characterized in that a diode is connected between a main terminal of the third switching element and the control terminal of the first switching element, and a series circuit of a primary terminal of a photocoupler and a resistor is connected between the connection point of the main terminal of the third switching element and diode and the negative electrode of the reverse biasing power source, or between the connection point of the main terminal of the third switching element and diode and the negative electrode of the forward biasing power source.

7. The semiconductor drive device according to claim 1, characterized in that the fourth switching element is an N-channel type MOSFET.

8. The semiconductor drive device according to claim 1, characterized in that the fourth switching element is a PNP type transistor.

9. The semiconductor drive device according to claim 1, characterized in that a diode is connected between a main terminal of the fourth switching element and the control terminal of the second switching element, and a series circuit of a primary terminal of a photocoupler and a resistor is connected between the connection point of the diode and fourth switching element and the positive electrode of the forward biasing power source, or between the connection point of the diode and fourth switching element and the positive electrode of the reverse biasing power source.

10. A semiconductor drive device characterized by including: a turn-on drive circuit including a forward biasing power source, a first switching element, and a turn-on gate resistor for turning on a semiconductor element; and a turn-off drive circuit including a reverse biasing power source, a second switching element, and a turn-off gate resistor for turning off the semiconductor element, wherein the forward biasing power source and reverse biasing power source are connected in series, a first thermistor being connected in series with the first switching element, and a second thermistor is connected in series with the second switching element, and wherein there is provided means of turning off the first or second switching element when the temperature of either one of the first thermistor or second thermistor rises to or above a predetermined value.

11. The semiconductor drive device according to claim 10, characterized in that the means of turning off the first switching element is a third switching element wherein one end of the first thermistor and one main terminal are connected to the positive electrode of the forward biasing power source, the series connection point of the first thermistor and first switching element is connected to a control terminal, a resistor is connected between the control terminal and the negative electrode of the reverse biasing power source or the negative electrode of the forward biasing power source, and the other main terminal is connected to a control terminal of the first switching element.

12. The semiconductor drive device according to claim 10, characterized in that the means of turning off the second switching element is a fourth switching element wherein one end of the second thermistor and one main terminal are connected to the negative electrode of the reverse biasing power source, the series connection point of the second thermistor and second switching element is connected to a control terminal, a resistor is connected between the control terminal and the positive electrode of the reverse biasing power source or the positive electrode of the forward biasing power source, and the other main terminal is connected to a control terminal of the second switching element.

13. The semiconductor drive device according to claim 10, characterized in that the third switching element is a P-channel type MOSFET.

14. The semiconductor drive device according to claim 10, characterized in that the third switching element is a PNP type transistor.

15. The semiconductor drive device according to claim 10, characterized in that a diode is connected between a main terminal of the third switching element and the control terminal of the first switching element, and a series circuit of a primary terminal of a photocoupler and a resistor is connected between the connection point of the main terminal of the third switching element and diode and the negative electrode of the reverse biasing power source or the negative electrode of the forward biasing power source.

16. The semiconductor drive device according to claim 10, characterized in that the fourth switching element is an N-channel type MOSFET.

17. The semiconductor drive device according to claim 10, characterized in that the fourth switching element is a PNP type transistor.

18. The semiconductor drive device according to claim 10, characterized in that a diode is connected between a main terminal of the fourth switching element and the control terminal of the second switching element, and a series circuit of a primary terminal of a photocoupler and a resistor is connected between the connection point of the diode and fourth switching element and the positive electrode of the forward biasing power source or the positive electrode of the reverse biasing power source.

* * * * *